US010255956B2

(12) United States Patent
Iwase et al.

(10) Patent No.: US 10,255,956 B2
(45) Date of Patent: Apr. 9, 2019

(54) SEMICONDUCTOR DEVICE (71) Applicant: RENESAS ELECTRONICS CORPORATION, Tokyo (JP)

(72) Inventors: Takashi Iwase, Tokyo (JP); Ken Matsubara, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/845,698

(22) Filed: Dec. 18, 2017

(65) Prior Publication Data
US 2018/0233181 A1 Aug. 16, 2018

(30) Foreign Application Priority Data

Feb. 14, 2017 (JP) .................. 2017-024664

(51) Int. Cl.
*G11C 7/00* (2006.01)
*G11C 7/12* (2006.01)
*G11C 7/14* (2006.01)
*G11C 7/06* (2006.01)
*G11C 16/10* (2006.01)
*G11C 16/16* (2006.01)
*G11C 16/24* (2006.01)
*G11C 16/32* (2006.01)
*G11C 16/26* (2006.01)

(52) U.S. Cl.
CPC .............. *G11C 7/12* (2013.01); *G11C 7/062* (2013.01); *G11C 7/067* (2013.01); *G11C 7/14* (2013.01); *G11C 16/10* (2013.01); *G11C 16/16* (2013.01); *G11C 16/24* (2013.01); *G11C 16/32* (2013.01); *G11C 16/26* (2013.01)

(58) Field of Classification Search
CPC ......................................... G11C 7/12
USPC .................................... 365/189.06
See application file for complete search history.

(56) References Cited

U.S. PATENT DOCUMENTS 8,416,602 B2 4/2013 Kitagawa et al.
2011/0116321 A1* 5/2011 Agari .................. G11C 5/14
365/185.23

FOREIGN PATENT DOCUMENTS

JP 2011-165297 A 8/2011

* cited by examiner

*Primary Examiner* — Hoai V Ho
(74) *Attorney, Agent, or Firm* — McDermott Will & Emery LLP (57) ABSTRACT

According to an embodiment, a semiconductor device includes a pre-charge transistor configured to supply a pre-charge voltage to a bit line, a sense amplifier configured to change a logic level of an output signal according to a result of a comparison between a drawing current of a storage element and a reference current, a clamp transistor disposed between the bit line BL and the sense amplifier, and a clamp voltage output transistor, in which a gate of the clamp voltage output transistor is connected to a gate of the clamp transistor, a source of the clamp voltage output transistor is connected to a back gate thereof, the pre-charge voltage is supplied to the source of the clamp voltage output transistor, a drain of the clamp voltage output transistor is connected to the gate thereof, and a ground voltage is supplied to a back gate of the clamp transistor.

7 Claims, 11 Drawing Sheets

SEMICONDUCTOR DEVICE

CROSS-REFERENCE TO RELATED APPLICATIONS

This application is based upon and claims the benefit of priority from Japanese patent application No. 2017-024664, filed on Feb. 14, 2017, the disclosure of which is incorporated herein in its entirety by reference.

BACKGROUND

The present disclosure relates to a semiconductor device, and for example to a semiconductor device including a storage device including a plurality of storage elements having a current drawing capability that changes according to a value of data to be stored.

In recent years, nonvolatile memories such as flash memories have been widely used. In such a nonvolatile memory, storage elements having a current drawing capability that changes according to a value of data to be stored are used. Specifically, the storage element changes its current characteristic that is exhibited when the storage element is in an activated state in which the storage element allows a current to flow by its writing operation for data to be held. Then, in a process in which data is read from the storage element, a value of data held in the storage element is determined by reading a magnitude of a drawing current of the storage element. Japanese Unexamined Patent Application Publication No. 2011-165297 discloses an example of a reading circuit for such a storage element.

A nonvolatile semiconductor memory device disclosed in Japanese Unexamined Patent Application Publication No. 2011-165297 includes: a storage element whose electrical-charge discharging speeds of two electrodes change according to logic of stored data; a cell line connected to one of the electrodes of the storage element; a sense amplifier including a sense node connected to the cell line, the sense amplifier being configured to read the logic of data by comparing a potential at the sense node with a reverence potential; and a read control circuit capable of changing its operation between a dynamic sense operation in which reading is performed by pre-charging the cell line and charging or discharging the cell line through the storage element and a static sense operation in which reading is performed in a state where a current load is connected to the sense node.

SUMMARY

However, the present inventors have found the following problem. That is, in the technique disclosed in Japanese Unexamined Patent Application Publication No. 2011-165297, since the pre-charging in the dynamic sense operation is performed through a load separation switch, variations occur in the pre-charge voltage. Therefore, in the technique disclosed in Japanese Unexamined Patent Application Publication No. 2011-165297, a read sense margin decreases due to the variations and hence a reading time is increased to ensure reading accuracy, thus causing a problem that an operating speed cannot be sufficiently increased.

Other objects and novel features will be more apparent from the following description in the specification and the accompanying drawings.

According to one embodiment, a semiconductor device includes: a storage element having a current drawing capability that changes according to a value of data to be stored; a bit line connected to an output node of the storage element; a pre-charge transistor configured to supply a pre-charge voltage to the bit line; a sense amplifier configured to change a logic level of an output signal according to a result of a comparison between a drawing current of the storage element and a reference current; a clamp transistor disposed between the bit line and the sense amplifier; and a clamp voltage output transistor configured to supply a clamp voltage to the clamp transistor, in which a gate of the clamp voltage output transistor is connected to a gate of the clamp transistor, a source of the clamp voltage output transistor is connected to a back gate thereof, the pre-charge voltage is supplied to the source of the clamp voltage output transistor, a drain of the clamp voltage output transistor is connected to the gate thereof, and a ground voltage is supplied to a back gate of the clamp transistor.

According to an embodiment, in a semiconductor device, it is possible to increase an operating speed while ensuring a large sense margin in a dynamic sense operation for data held in a storage element.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

For clarifying the explanation, the following descriptions and the drawings may be partially omitted and simplified as appropriate. The same symbols are assigned to the same components throughout the drawings and duplicated explanations are omitted as required.

Figure 1:
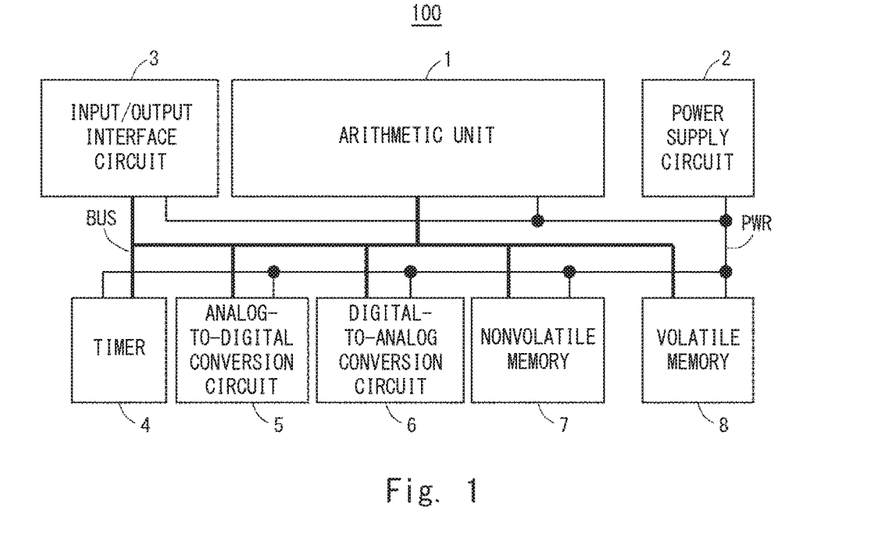
FIG. 1 is a block diagram of a semiconductor device according to a first embodiment.

FIG. 1 shows a block diagram of a semiconductor device 100 according to a first embodiment. As shown in FIG. 1, the semiconductor device 100 according to the first embodiment is a semiconductor device including at least a nonvolatile memory. FIG. 1 shows an MCU (Micro Controller Unit) as an example of the semiconductor device 100 equipped with the nonvolatile memory. In the example shown in FIG. 1, the semiconductor device 100 according to the first embodiment includes an arithmetic unit 1, a power supply circuit 2, an input/output interface circuit 3, a timer 4, an analog-to-digital conversion circuit 5, a digital-to-analog conversion circuit 6, a nonvolatile memory 7, and a volatile memory 8.

In the semiconductor device 100, the power supply circuit 2 generates an internal power supply voltage VCC based on externally-supplied electric power and supplies the generated internal power supply voltage VCC to each circuit block through a power supply line PWR. Further, the semiconductor device 100 is configured so that circuit blocks can communicate with each other through a bus line BUS.

The semiconductor device 100 performs various processes by having the arithmetic unit 1 load a program stored in the nonvolatile memory 7 and execute the loaded program. Further, the semiconductor device 100 transmits/receives signals to/from external devices such as other semiconductor devices through the input/output interface circuit 3. The timer 4, the analog-to-digital conversion circuit 5, and the digital-to-analog conversion circuit 6 implement functions of respective circuit blocks based on instructions from the arithmetic unit 1. The volatile memory 8 is a storage device that temporarily holds intermediate data generated during a process performed in each circuit block. Conceivable examples of the nonvolatile memory 7 include a flash memory. Conceivable examples of the volatile memory 8 include a DRAM (Dynamic Random Access Memory).

Figure 2:
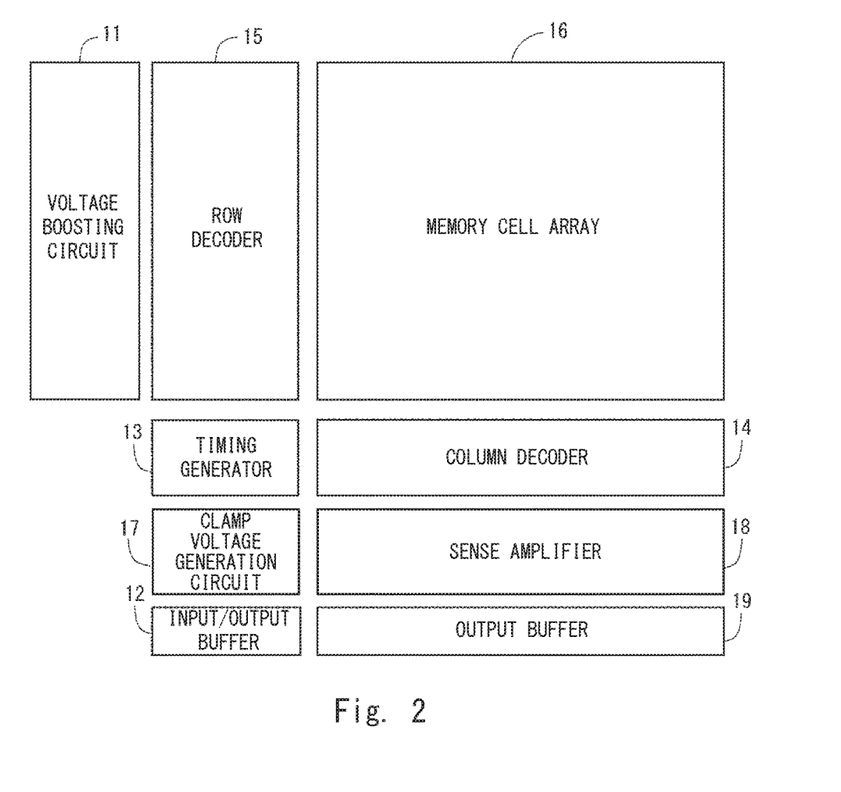
FIG. 2 is a block diagram of a nonvolatile memory according to the first embodiment.

One of the features of the semiconductor device 100 according to the first embodiment lies in a configuration of the nonvolatile memory 7. Therefore, the configuration of the nonvolatile memory 7 is explained hereinafter in detail. Accordingly, FIG. 2 shows a block diagram of the nonvolatile memory 7 according to the first embodiment. As shown in FIG. 2, the nonvolatile memory 7 according to the first embodiment includes a voltage boosting circuit (or a voltage raising circuit) 11, an input/output buffer 12, a timing generator 13, a column decoder 14, a row decoder 15, a memory cell array 16, a clamp voltage generation circuit 17, a sense amplifier 18, and an output buffer 19.

The voltage boosting circuit 11 generates a raised voltage that is obtained by raising the internal power supply voltage VCC supplied from the power supply circuit 2 and used in the nonvolatile memory 7. The input/output buffer 12 transmits/receives a control command and an access address to/from other circuit blocks. The timing generator 13 controls an operating timing of each circuit block in the nonvolatile memory 7. The memory cell array 16 is an area in which memory cells are arranged in a lattice pattern. The column decoder 14 activates a column in which, among the memory cells in the memory cell array 16, memory cells to be activated are disposed. The row decoder 15 activates a row in which, among the memory cells in the memory cell array 16, memory cells to be activated are disposed. The clamp voltage generation circuit 17 generates a clamp voltage that is supplied to clamp transistors in the memory cell array 16. The sense amplifier 18 is an amplifier that reads data held in memory cells in the memory cell array 16.

The output buffer 19 is an amplifier that outputs a data value output. from the sense amplifier 18 to other circuit blocks.

One of the features of the nonvolatile memory 7 according to the first embodiment lies in a configuration of the column decoder 14, the memory cell array 16, the clamp voltage generation circuit. 17, and the sense amplifier 18. The configuration of the column decoder 14, the memory cell array 16, the clamp voltage generation circuit 17, and the sense amplifier 18 is explained hereinafter in detail.

Figure 3:
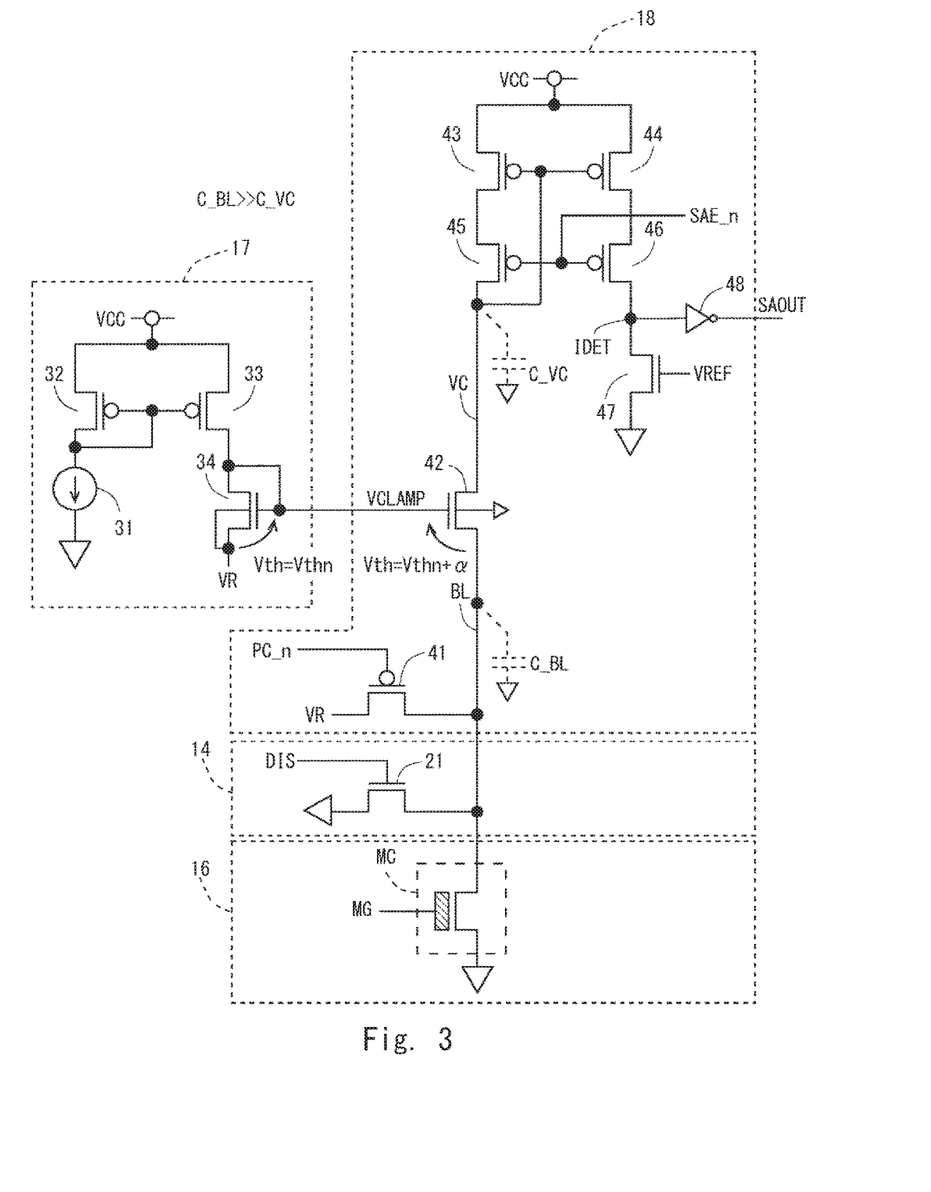
FIG. 3 is a circuit diagram of a column decoder, a memory cell, a clamp voltage generation circuit, and a sense amplifier according to a first embodiment.

FIG. 3 shows a circuit diagram of the column decoder, the memory cell, the clamp voltage generation circuit, and the sense amplifier according to the first embodiment. Note that in the example shown in FIG. 3, only a part related to one memory cell MC among a plurality of memory cells MC is shown. Further, in the example shown in FIG. 3, only characteristic circuits and transistors related to the operation performed by the nonvolatile memory 7 according to the first embodiment are shown.

A plurality of memory cells MC arranged in the memory cell array 16 are storage elements each of which has a current drawing capability that changes according to a value of data to be stored and are arranged in a lattice pattern in the memory cell array 16. FIG. 3 shows only one memory cell MC among the plurality of memory cells MC arranged in the memory cell array. The memory cell MC includes a memory transistor and this memory transistor is, for example, a MONOS-type transistor. A source of the memory transistor is connected to a ground line and a memory gate voltage MG is supplied to a gate thereof. Further, a bit line BL is connected to a drain of the memory transistor. Note that the drain of the memory transistor serves as an output node of the memory cell MC.

A discharge transistor 21 is provided in the column decoder 14. A source of the discharge transistor 21 is connected to the ground line and its drain is connected to the bit line BL. Further, a discharge control signal DIS is supplied to a gate of the discharge transistor 21. A pre-charge transistor 41 is provided.

The clamp voltage generation circuit 17 includes a constant current source 31, PMOS transistors 32 and 33, and a clamp voltage output transistor 34. The constant current source 31 is connected between the ground line and a drain of the PMOS transistor 32 and outputs a constant current. The PMOS transistors 32 and 33 form a current-mirror circuit and output the constant current output from the constant current source 31 to a drain of the clamp voltage output transistor 34. Specifically, the internal power supply voltage VCC is supplied to drains of the PMOS transistors 32 and 33. A source of the PMOS transistor 32 is connected to a gate thereof. Further, gates of the PMOS transistors 32 and 33 are connected to each other.

A source of the clamp voltage output transistor 34 is connected to a back gate thereof and a pre-charge voltage VR is supplied to the source. Further, the constant current is supplied from the PMOS transistor 33 to the drain of the clamp voltage output transistor 34 and a gate of the clamp voltage output transistor 34 is connected to the drain thereof.

The sense amplifier 18 includes a pre-charge transistor 41, a clamp transistor 42, PMOS transistors 43 to 46, an NMOS transistor 47, an inverter circuit 48, a sense node VC, and a current sense node IDET.

A source of the pre-charge transistor 41 is connected to the bit line EL and the pre-charge voltage VR is supplied to a drain thereof. Further, a pre-charge control signal PC n is supplied to a gate of the pre-charge transistor 41.

A parasitic capacitance C_BL is formed in the bit line BL. A clamp voltage VCLAMP is supplied to a gate of the clamp transistor 42 and its source is connected to the bit line BL. Further, a back gate of the clamp transistor 42 is connected to the ground line and its drain is connected to a drain of the PMOS transistor 45. Further, a line connected to the drain of the clamp transistor 42 serves as the sense node VC.

The internal power supply voltage VCC is supplied to sources of both of the PMOS transistors 43 and 44 and their gates are connected to each other. Further, the gate of the PMOS transistor 43 is connected to a drain of the PMOS transistor 45. A drain of the PMOS transistor 43 is connected to a source of the PMOS transistor 45. A drain of the PMOS transistor 44 is connected to a source of the PMOS transistor 46.

A sense amplifier enable signal SAE_n is supplied to gates of the PMOS transistors 45 and 46. A drain of the PMOS transistor 45 is connected to the drain of the clamp transistor 42 through the sense node VC. A drain of the PMOS transistor 46 is connected to a drain of the NMOS transistor 47 through the current sense node IDET.

A source of the NMOS transistor 47 is connected to the ground line. A reference voltage VREF is supplied to a gate of the NMOS transistor 47. The NMOS transistor 47 functions as a current source that outputs a reference current having a constant current value according to a voltage value of the reference voltage VREF.

The inverter circuit 48 is a buffer circuit that functions as a comparator and its input terminal is connected to the current sense node IDET. Further, the inverter circuit 48 outputs an output signal SAOUT from its output terminal. The inverter circuit 48 has a threshold voltage (e.g., a voltage about half of the internal power supply voltage VOC (i.e., VCC/2)) at which a logic level of its output signal is changed. The inverter circuit 48 changes the logic level of the output signal from a high level to a low level when a voltage generated at the current sense node IDET exceeds this threshold voltage.

A relation between a threshold voltage of the clamp voltage output transistor 34 and a threshold voltage of the clamp transistor 42 is explained hereinafter. Firstly, both the clamp transistor 42 and the clamp voltage output transistor 34 are NMOS transistors. Further, in the semiconductor device 100 according to the first embodiment, the back gate of the clamp voltage output transistor 34 is connected to the source thereof and a pre-charge voltage is supplied to the source. Meanwhile, the ground line is connected to the back gate of the clamp transistor 42 and hence the ground voltage is supplied to the back gate. Further, the source of the clamp transistor 42 is connected to the output node of the memory cell MC. Therefore, a substrate effect for the clamp transistor 42 differs from that for the clamp voltage output transistor 34 and hence their threshold voltages differ from each other due to this difference in the substrate effect. In FIG. 3, this difference between threshold voltages is indicated by a symbol "α". Specifically, when the threshold voltage of the clamp voltage output transistor 34 is a voltage Vth, the threshold voltage of the clamp transistor 42 is expressed as "Vth+α".

Figure 4:
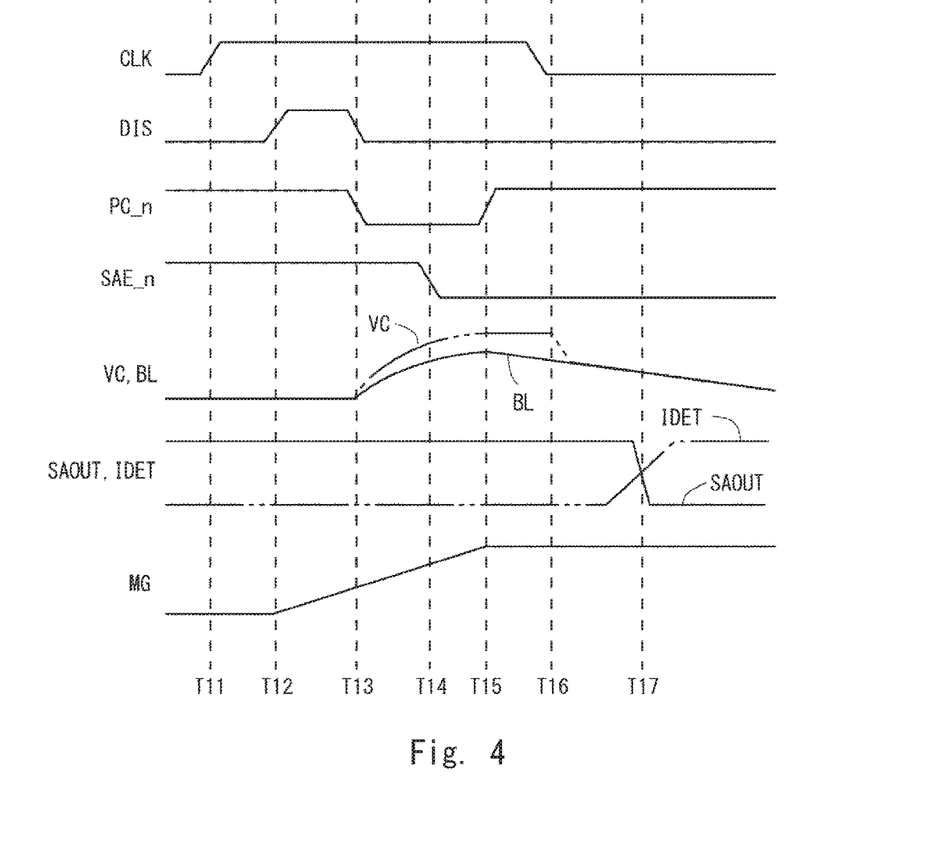
FIG. 4 is a timing chart showing an operation of a nonvolatile memory according to the first embodiment when the nonvolatile memory is in an erasing state.

Next, an operation performed by the nonvolatile memory according to the first embodiment is explained. Therefore, firstly, FIG. 4 shows a timing chart showing an operation performed by the nonvolatile memory according to the first embodiment when the nonvolatile memory is in an erasing state. A clock signal CLK shown in the timing chart in FIG. 4, etc. indicates a timing at which data is read from memory cells disposed in one row and is input to the timing generator 13. Further, a discharge control signal DIS, a pre-charge control signal PC_n, and a sense amplifier enable signal SAE_n in the timing chart shown in FIG. 4, etc. are signals generated by the timing generator 13. Further, a memory gate voltage MG is a signal generated by the row decoder 15.

As shown in FIG. 4, in the nonvolatile memory according to the first embodiment, as the clock signal CLK rises at a timing T11, a reading operation is started. Then, at a timing T12, a discharge operation for the bit line BL is performed when the discharge control signal DIS changes from a high level to a low level. Further, at the timing T12, the memory gate voltage MG starts to be raised. Since the amplitude of the memory gate voltage MG is larger than those of the other control signals, the raising of the memory gate voltage MG takes a longer time than a time required for raising other control signals.

Then, at a timing T13, the discharge operation to the bit line BL is finished and a pre-charge operation is started by changing the discharge control signal DIS from the high level to a low level and changing the pre-charge control signal PC n from the high level to a low level. Through this pre-charge operation, voltages of the bit line BL and the sense node VC rise.

Next, at a timing T14, the sense amplifier enable signal SAE_n is changed from the high level to a low level. As a result, the PMOS transistors 45 and 46 become a conductive state and the PMOS transistors 43 and 44 start to function as a current-mirror circuit.

Then, at a timing T15 at which the memory gate voltage MG has become a sufficiently high voltage, the pre-charge control signal PC_n is changed from the low level to a high level. In the example shown in FIG. 4, since the memory cell MC is in the erasing state, the memory cell MC starts to draw a memory current from the bit line FL at the timing T15. Further, at the timing T15, since the voltage of the bit line BL is close to the pre-charge voltage and the voltage between the gate and the source of the clamp transistor 42 is lower than the threshold voltage expressed as "Vth+α", the clamp transistor 42 is in an off-state. Therefore, in the memory current drawing operation, which is started at the timing T15, only the voltage of the bit line BL decreases.

Then, when the voltage of the bit line BL decreases and, as a result, the voltage between the gate and the source of the clamp transistor 42 exceeds the threshold voltage Vth+α, the clamp transistor 42 becomes an on-state and the voltage at the sense node VC becomes equal to the voltage of the bit line BL. The timing at which the clamp transistor 42 becomes the on-state is a timing T16. As a result, a current corresponding to the memory current flows into the current sense node IDET through the sense node VC and the current-mirror circuit formed by the PMOS transistors 43 and 44. Consequently, the voltage at the current sense node IDET rises. Then, at a timing T17 at which the voltage at the current sense node IDET exceeds the threshold voltage of the inverter circuit 48, the logic level of the output signal SAOUT is changed from the high level to a low level.

Figure 5:
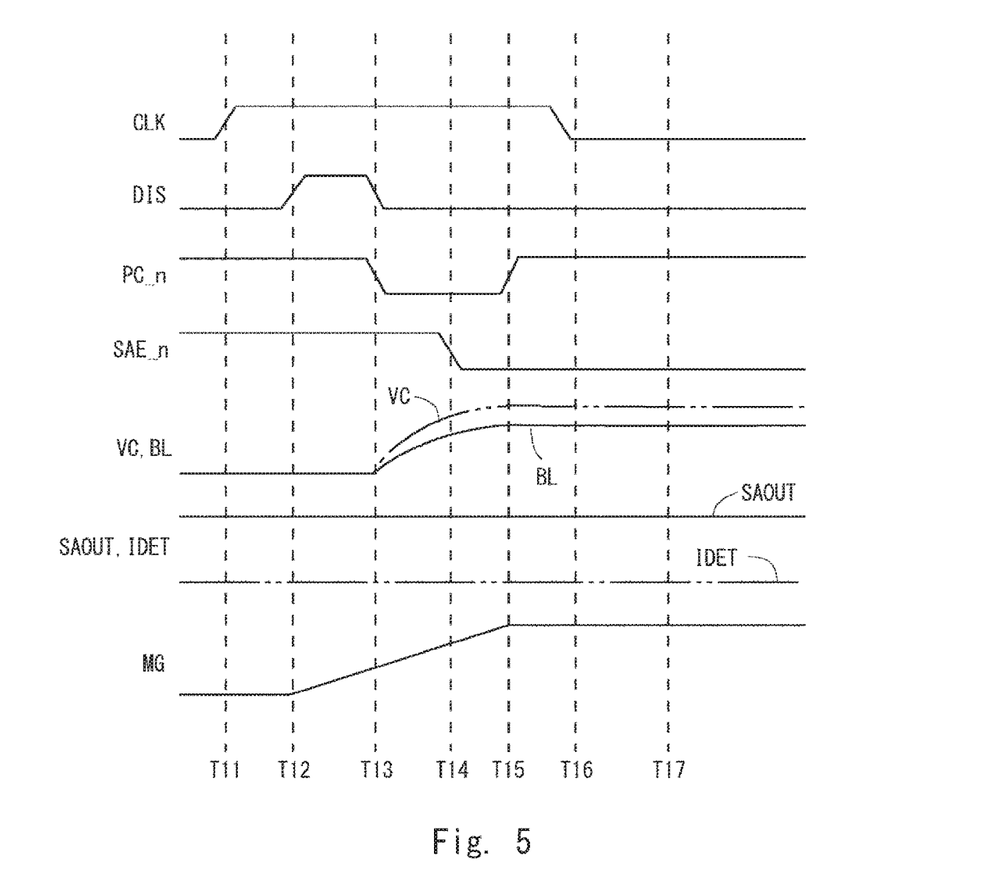
FIG. 5 is a timing chart showing an operation performed by the nonvolatile memory according to the first embodiment when the nonvolatile memory is in a writing state.

Next, an operation that is performed by the nonvolatile memory according to the first embodiment when the memory cell MC is in a writing state is explained. Therefore, FIG. 5 shows a timing chart showing an operation performed by the nonvolatile memory according to the first embodiment when the nonvolatile memory is in the writing state. Operations performed before the timing T15 at which the pre-charge is completed when the memory cell MC is in the writing state are the same as those performed when the memory cell MC is in the erasing state shown in FIG. 4.

However, when the memory cell MC is in the writing state, the drawing of the memory current from the bit line BL by the memory cell MC is not performed. Therefore, even when the pre-charge operation is stopped at the timing T15, the voltage of the bit line BL does not decrease. Therefore, when the memory cell MC is in the writing state, the off-state of the clamp transistor 42 is maintained even after the pre-charge operation is stopped and hence no memory current flows into the current sense node IDET. Accordingly, when the memory cell MC is in the writing state, the reverse of the logic level of the output signal SAOUT does not occur at the timing T17.

As explained above, in the semiconductor device 100 according to the first embodiment, the pre-charge transistor 41 is directly connected to the bit line BL, which is disposed between the clamp transistor 42 and the memory cell MC. By this configuration, in the semiconductor device 100 according to the first embodiment, it is possible to pre-charge the bit line BL to the pre-charge voltage VR without being affected by the clamp voltage that is supplied by the clamp transistor 42 in the pre-charge operation for the bit line BL. In other words, in the semiconductor device 100 according to the first embodiment, it is possible to accurately pre-charge the bit line BL to the voltage level of the pre-charge voltage VR. As a result, in the semiconductor device 100 according to the first embodiment, it is possible to increase the speed of the pre-charge operation.

Further, the semiconductor device 100 according to the first embodiment includes the clamp transistor 42 that clamps the voltage of the bit line BL. The clamp voltage VCLAMP, which is obtained by adding the threshold voltage Vth of the clamp voltage output transistor 34 to the pre-charge voltage VR, is supplied to the gate of the clamp transistor 42. In the semiconductor device 100 according to the first embodiment, it is possible to prevent a decrease in The reading speed, which would otherwise be caused due to the parasitic capacitance C_BL formed in the bit line BL, by clamping the voltage of the bit line BL.

Further, in the semiconductor device 100 according to the first embodiment, the ground voltage is supplied to the back gate of the clamp transistor 42 and the pre-charge voltage VR is supplied to the back gate of the clamp voltage output transistor 34. It should be noted that if the pre-charge voltage VR is supplied to the back gate of the clamp transistor 42 as in the case of the clamp voltage output transistor 34, the clamp transistor 42 has the same threshold voltage as that of the clamp voltage output transistor 34, thus causing a problem that a malfunction could occur. For example, when the voltage of the bit line BL decreases beyond the pre-charge voltage VR even by a small amount, the clamp transistor 42 is changed to an on-state. Therefore, there is a problem that when data is read from, in particular, a memory cell MC which is in a writing state, an error could occur in the read data. However, in the semiconductor device 100 according to the first embodiment, the threshold voltage of the clamp transistor 42 is higher than the threshold voltage of the clamp voltage output transistor 34 to some extent. Therefore, the above-described malfunction problem is less likely to occur. That is, in the semiconductor device 100 according to the first embodiment, since the read sense margin is large, the data reading accuracy can be improved.

Further, it is possible to improve the operating speed and ensure the sense margin at the same time by changing the pre-charge voltage VR so that it follows the change in the reference voltage VREF in the circuit shown in FIG. 3. Since the reference current generated by the NMOS transistor 47 can be increased by setting the reference voltage VREF to a high value, the read sense margin can be increased. However, there is a problem that if the reference current is increased while maintaining the memory current, the time required to reverse the output of the inverter circuit 48 increases. However, in the semiconductor device 100 according to the first embodiment, by increasing the pre-charge voltage VR according to the reference voltage VREF, it is possible to increase the clamp voltage VCLAMP and thereby increase the memory current. Therefore, in the semiconductor device 100 according to the first embodiment, it is possible to improve the operating speed and ensure the sense margin at the same time by changing the pre-charge voltage VR so that it follows the change in the reference voltage VREF.

Second Embodiment

Figure 6:
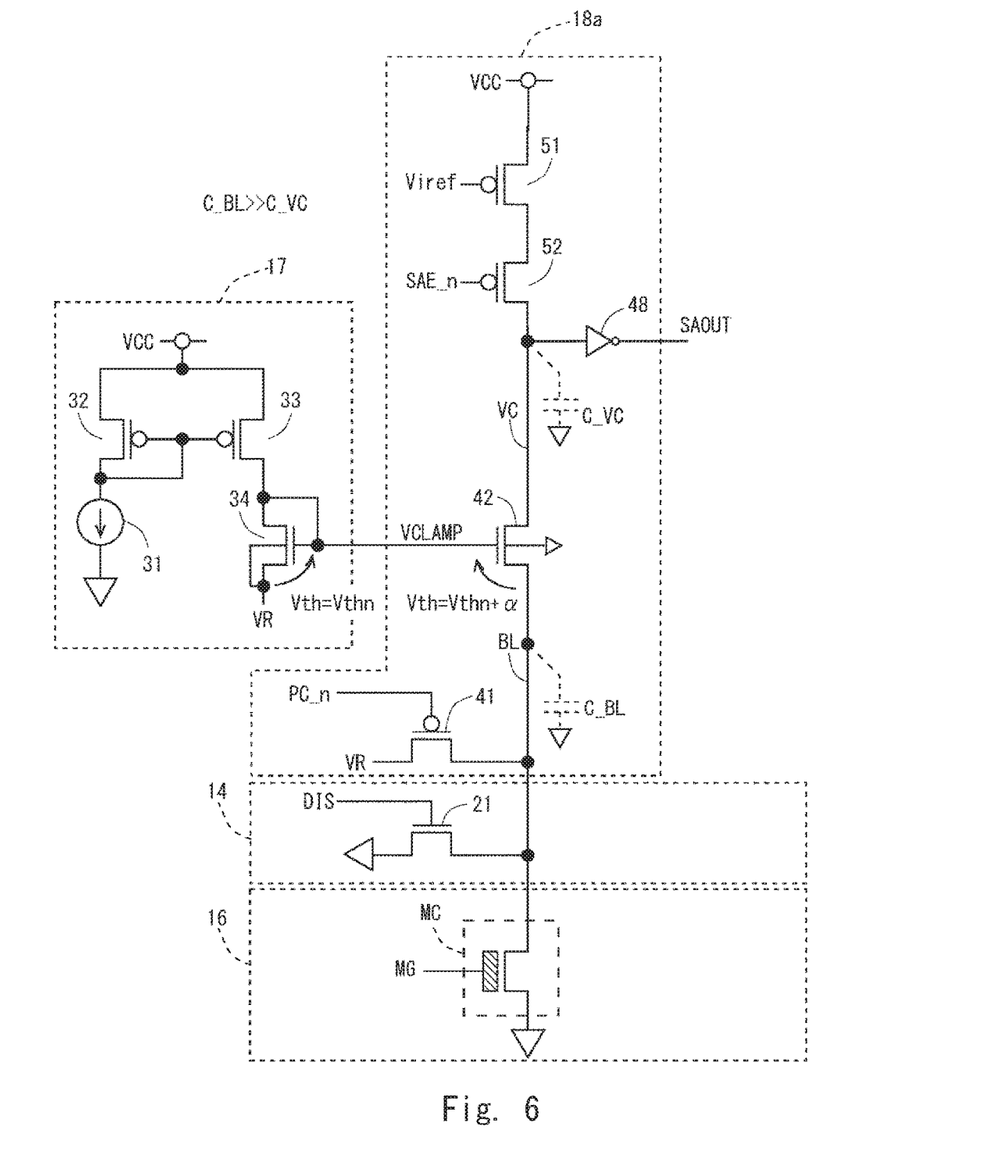
FIG. 6 is a circuit diagram of a column decoder, a memory cell, a clamp voltage generation circuit, and a sense amplifier according to a second embodiment.

In a second embodiment, a sense amplifier 18a, which is another example of the sense amplifier 18, is explained. Note that in the explanation of the second embodiment, the same symbols as those in the first embodiment are assigned to the same components as those in the first embodiment and their explanations are omitted. FIG. 6 shows a circuit diagram of a column decoder, a memory cell, a clamp voltage generation circuit, and a sense amplifier according to the second embodiment. As shown in. FIG. 6, the sense amplifier 18a includes a pre-charge transistor 41, a clamp transistor 42, PMOS transistors 51 and 52, an inverter circuit 48, and a sense node VC.

An internal power supply voltage VCC is supplied to a source of the PMOS transistor 51 and a reference voltage Viref is supplied to a gate thereof. Further, a drain of the PMOS transistor 51 is connected to a source of the PMOS transistor 52. A sense amplifier enable signal SAE_n is supplied to a gate of the PMOS transistor 52 and its drain is connected to a drain of the clamp transistor 42 through the sense node VC.

That is, in the sense amplifier 18a according to the second embodiment, a reference current is supplied to the sense node VC by using the PMOS transistor 51 as a reference current generation circuit that generates the reference current and changing the PMOS transistor 52 to an on-state based on the sense amplifier enable signal SAE_n. Further, as the clamp transistor 42 becomes an on-state, a memory current is supplied to the sense node VC. Further, in the sense amplifier 18a, a logic level of an output signal SAOUT is changed by comparing a voltage at the sense node VC, which changes based on a difference between the reference current and the memory current in the sense node VC, with a threshold of the inverter circuit 48.

Figure 7:
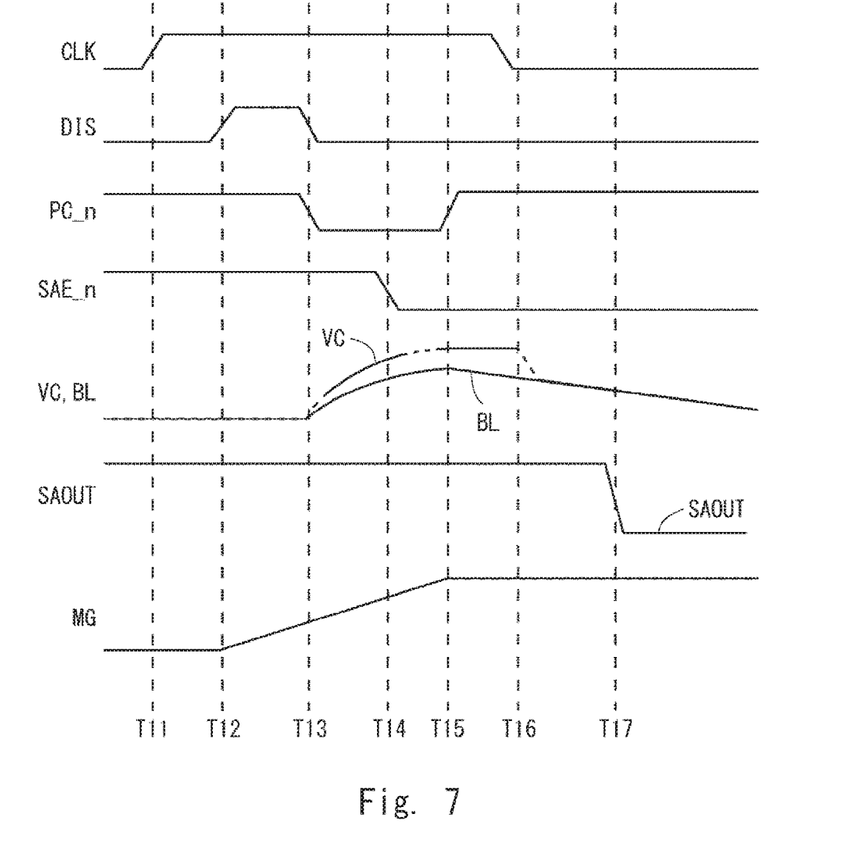
FIG. 7 is a timing chart showing an operation of a nonvolatile memory according to the second embodiment when the nonvolatile memory is in an erasing state.
Figure 8:
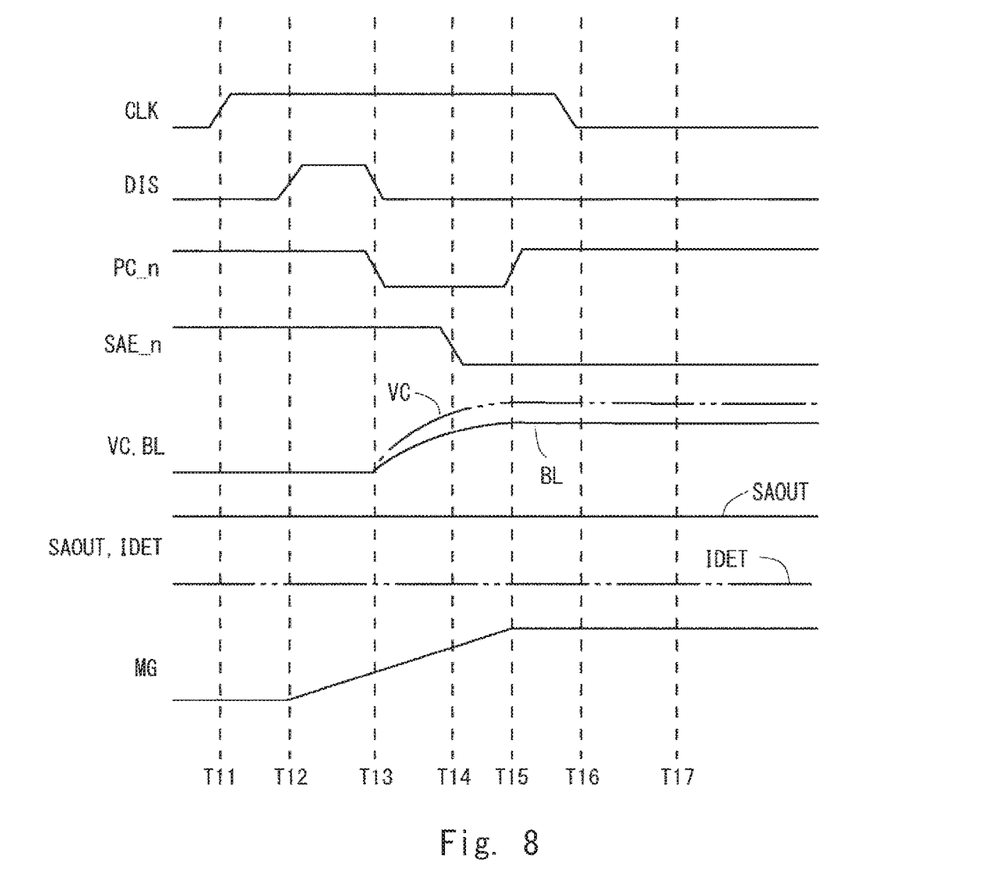
FIG. 8 is a timing chart showing an operation performed by the nonvolatile memory according to the second embodiment when the nonvolatile memory is in a writing state.

An operation performed by a nonvolatile memory including the sense amplifier 18a according to the second embodiment is explained. Therefore, FIG. 7 shows a timing chart showing an operation performed by the nonvolatile memory according to the second embodiment when the nonvolatile memory is in an erasing state. Further, FIG. 8 shows a timing chart showing an operation performed by the nonvolatile memory according to the second embodiment when the nonvolatile memory is in a writing state. FIGS. 7 and 8 show operations in the case where the same operations as those performed by the nonvolatile memory according to the first embodiment shown in FIGS. 4 and 5 are performed by the nonvolatile memory according to the second embodiment.

As shown in FIGS. 7 and 8, it can be understood that in the nonvolatile memory according to the second embodiment, the logic level of the output signal SAOUT changes according to the change in the voltage at the sense node VC, rather than according to the change in the voltage at the current sense node IDET.

As understood from the above explanation, the sense amplifier 18a of the nonvolatile memory according to the second embodiment can be formed by using a smaller number of circuit components than the number of components used in the sense amplifier 18 according to the first embodiment. Therefore, it is possible to reduce the circuit size of the nonvolatile memory according to the second embodiment compared to the circuit size of the nonvolatile memory according to the first embodiment.

Third Embodiment

Figure 9:
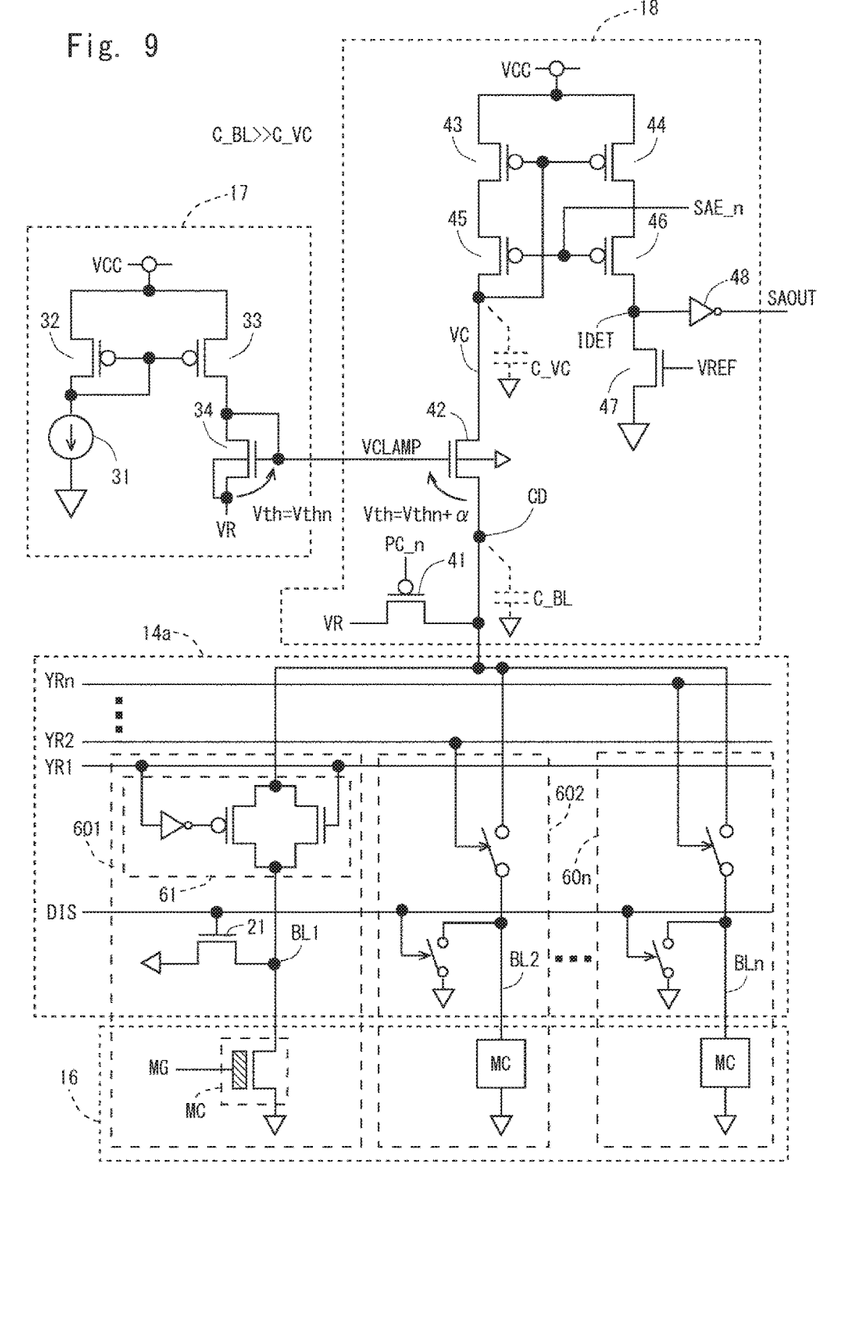
FIG. 9 is a circuit diagram of a column decoder, a memory cell, a clamp voltage generation circuit, and a sense amplifier according to a third embodiment.

In a third embodiment, a column decoder 14a, which is another example of the column decoder 14, is explained. Note that in the explanation of the third embodiment, the same symbols as those in the first embodiment are assigned to the same components as those in the first embodiment and their explanations are omitted. FIG. 9 shows a circuit diagram of a column decoder, a memory cell, a clamp voltage generation circuit, and a sense amplifier according to the third embodiment. As shown in FIG. 9, in the nonvolatile memory according to the third embodiment, one common sense amplifier 18 is provided for a plurality of memory cells MC. Therefore, the column decoder 14a has a cell selecting function of selecting one of the plurality of memory cells MC and connecting the selected memory cell MC to the sense amplifier 18.

As shown in FIG. 9, the nonvolatile memory according to the third embodiment includes, for one pair of a pre-charge transistor 41 and a clamp transistor 42, a plurality of memory units (in the example shown in FIG. 9, memory units 601 to 60n, n is an integer representing the number of memory units) each of which includes one memory cell MC.

Each of the memory units 601 to 60n includes a cell select switch 61, a discharge transistor 21, a memory cell MC, and a bit line BL. The cell select switch 61 and the discharge transistor 21 are included in the column decoder 14a and the memory cell MC and the bit line EL are included in the memory cell array 16. Note that in FIG. 9, the same numbers as those indicating the memory unit numbers are added at the ends of the symbols "BL" (BL1 to BLn in FIG. 9) in order to indicate the memory units to which the respective bit lines belong. Further, the cell select switch 61 is a transfer switch which is formed by joining a PMOS transistor and an NMOS transistor together, and in which the two transistors simultaneously become an on-state or an off-state according to a cell select signal YR.

Further, in the memory cell array 16 according to the third embodiment, a plurality of memory units are connected to a source of a clamp transistor 42 through a common bit line CD. In the nonvolatile memory according to the third embodiment, data is read from the plurality of memory cells MC by successively connecting the plurality of memory units to the common bit line CD one by one by using a plurality of cell select signals (e.g., YR1 to YRn) corresponding to the respective memory units.

Figure 10:
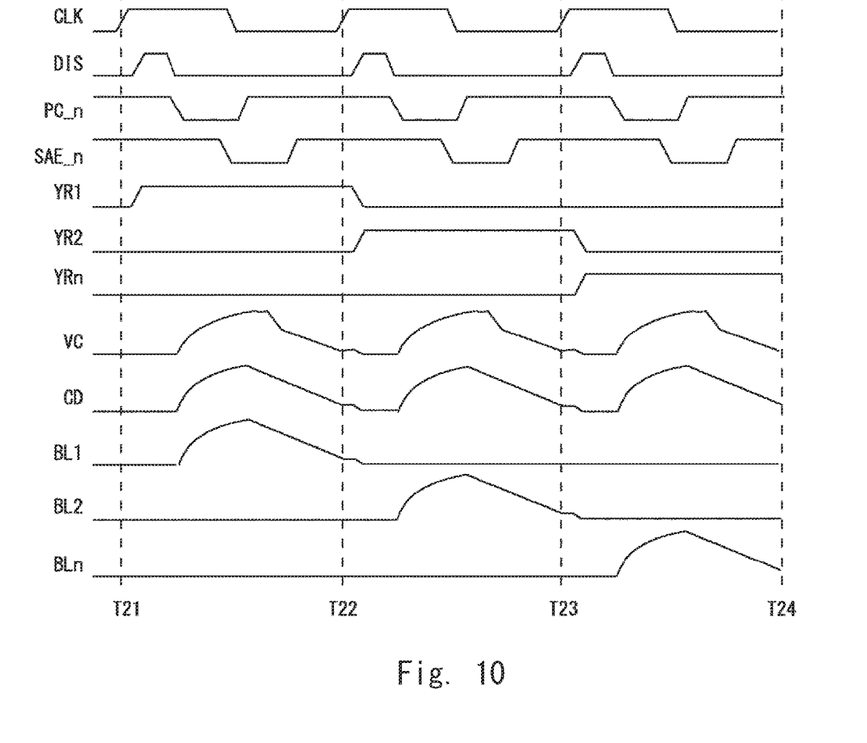
FIG. 10 is a timing chart showing an operation of a nonvolatile memory according to the third embodiment when the nonvolatile memory is in an erasing state.
Figure 11:
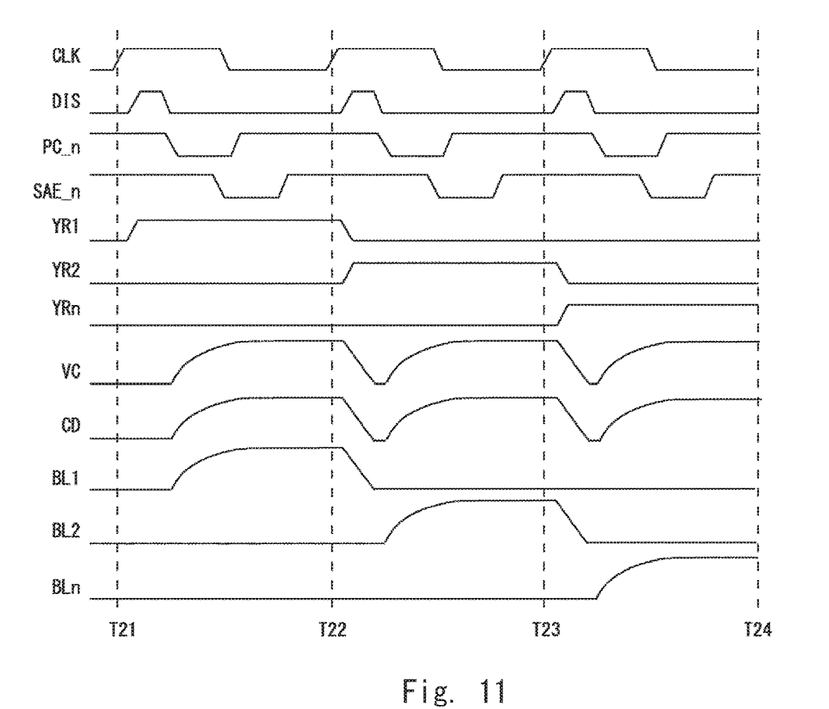
FIG. 11 is a timing chart showing an operation performed by the nonvolatile memory according to the third embodiment when the nonvolatile memory is in a writing state.

An operation performed by the nonvolatile memory according to the third embodiment is explained hereinafter. FIG. 10 shows a timing chart showing an operation performed by the nonvolatile memory according to the third embodiment when the nonvolatile memory is in an erasing state. Further, FIG. 11 shows a timing chart showing an operation performed by the nonvolatile memory according to the third embodiment when the nonvolatile memory is in a writing state. FIGS. 10 and 11 show operations performed by the nonvolatile memory according to the third embodiment, in which the same operation as that performed by the nonvolatile memory according to the first embodiment shown in FIGS. 4 and 5 is successively performed for each of the plurality of memory units.

As shown in FIGS. 10 and 11, in the nonvolatile memory according to the third embodiment, the plurality of memory units are successively selected and data is successively read from the selected memory unit.

As explained above, the sense amplifier 18 is provided for the plurality of memory units in the semiconductor device 100 according to the third embodiment. By adopting this configuration, it is possible to reduce the number of sense amplifiers 18. As a result, in the semiconductor device 100 according to the third embodiment, it is possible to reduce the circuit size of the nonvolatile memory even further compared to the other embodiments.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution. The first to third embodiments can be combined as desirable by one of ordinary skill in the art.

What is claimed is:

1. A semiconductor device comprising:
a storage element having a current drawing capability that changes according to a value of data to be stored;
a bit line connected to an output node of the storage element;
a pre-charge transistor, a source of the pre-charge transistor being connected to the bit line, a pre-charge voltage being supplied to a drain of the pre-charge transistor, and a pre-charge control signal being supplied to a gate of the pre-charge transistor;
a clamp voltage generation circuit comprising a clamp voltage output transistor, a source of the clamp voltage output transistor being connected to a back gate thereof, the pre-charge voltage being supplied to the source, a constant current being supplied to a drain of the clamp voltage output transistor, a gate of the clamp voltage output transistor being connected to the drain thereof, and the clamp voltage generation circuit being configured to output a voltage generated in the gate as a clamp voltage;
a clamp transistor, the clamp voltage being supplied to a gate of the clamp transistor, a source of the clamp transistor being connected to the bit line, and a back gate of the clamp transistor being connected to a ground line; and
a sense amplifier connected to a drain of the clamp transistor, the sense amplifier being configured to compare a reference current having a predetermined current value with a memory current drawn by the storage element through the clamp transistor and output an output signal.

2. The semiconductor device according to claim 1, wherein the pre-charge voltage is lower than a power supply voltage supplied to the clamp voltage generation circuit and the sense amplifier.

3. The semiconductor device according to claim 1, wherein the sense amplifier comprises:
a current-mirror circuit configured to supply the memory current to a current sense node;

a reference current generation circuit configured to generate the reference current based on a voltage value of a reference voltage and supply the generated reference current to the current sense node; and a comparison circuit configured to change a logic level of the output signal based on a voltage at the current sense node.

4. The semiconductor device according to claim 3, wherein a voltage value of the pre-charge voltage changes according to a change in the reference voltage.

5. The semiconductor device according to claim 1, wherein the sense amplifier comprises:

a reference current generation circuit configured to generate the reference current based on a voltage value of a reference voltage and supply the generated reference current to the drain of the clamp transistor; and a comparison circuit configured to change a logic level of the output signal based on a voltage of the drain of the clamp transistor.

6. The semiconductor device according to claim 5, wherein a voltage value of the pre-charge voltage changes according to a change in the reference voltage.

7. The semiconductor device according to claim 1, comprising a plurality of memory units each of which comprises a cell select switch whose open/close state is controlled based on a cell select signal, the storage element, the bit line, and a discharge transistor configured to draw an electric charge from the bit line according to a discharge control signal, wherein the source of the clamp transistor is connected to the plurality of memory units through a common bit line.

* * * * *